US008298964B2

(12) United States Patent
Sinha et al.

(10) Patent No.: US 8,298,964 B2
(45) Date of Patent: Oct. 30, 2012

(54) METHOD AND APPARATUS PROVIDING AIR-GAP INSULATION BETWEEN ADJACENT CONDUCTORS USING NANOPARTICLES

(75) Inventors: Nishant Sinha, Boise, ID (US); Gurtej Sandhu, Boise, ID (US); Neil Greeley, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/096,052

(22) Filed: Apr. 28, 2011

(65) Prior Publication Data

US 2011/0201211 A1    Aug. 18, 2011

Related U.S. Application Data

(62) Division of application No. 12/473,849, filed on May 28, 2009, now Pat. No. 7,952,174.

(51) Int. Cl.
*H01L 21/31* (2006.01)

(52) U.S. Cl. .............. 438/778; 257/632; 257/E21.24; 257/E23.24; 977/773

(58) Field of Classification Search .................. 438/778; 257/632, E21.24; 977/773
See application file for complete search history.

(56) References Cited

U.S. PATENT DOCUMENTS

| 6,946,382 | B2 | 9/2005 | Townsend, III et al. |
| 7,217,648 | B2 | 5/2007 | Lu et al. |
| 7,256,127 | B2 | 8/2007 | Gallagher et al. |
| 7,459,183 | B2 | 12/2008 | Dubois et al. |
| 7,714,339 | B2 | 5/2010 | Liu |
| 8,034,668 | B2 * | 10/2011 | Jang et al. ............. 438/129 |
| 2008/0308943 | A1 * | 12/2008 | Kawakita ............. 257/773 |
| 2011/0186956 | A1 * | 8/2011 | Hiroshige et al. ...... 257/467 |

FOREIGN PATENT DOCUMENTS

JP    2008-270161    *    2/2010

* cited by examiner

*Primary Examiner* — Kimberly Rizkallah
*Assistant Examiner* — Timor Karimy
(74) *Attorney, Agent, or Firm* — Dickstein Shapiro LLP

(57) ABSTRACT

A semiconductor device and a method of forming it are disclosed in which at least two adjacent conductors have an air-gap insulator between them which is covered by nanoparticles of insulating material being a size which prevent the nanoparticles from substantially entering into the air-gap.

10 Claims, 8 Drawing Sheets

METHOD AND APPARATUS PROVIDING AIR-GAP INSULATION BETWEEN ADJACENT CONDUCTORS USING NANOPARTICLES

This application is a divisional of application Ser. No. 12/473,849, filed May 28, 2009 now U.S. Pat. No. 7,952,174, the entire disclosure of which is incorporated herein by reference.

FIELD OF THE INVENTION

Embodiments described herein relate to the field of semiconductor devices. In particular, the embodiments relate to a method and apparatus providing air-gap insulators between adjacent conductors in semiconductor devices.

BACKGROUND OF THE INVENTION

Many semiconductor devices, for example, memory and other semiconductor devices, typically include adjacent co-planar conductors. The conductors are separated from one another by an insulating material to prevent shorts and minimize crosstalk. The insulating material should provide, among other things, low leakage currents, good mechanical strength, and low permittivity. A low permittivity insulator reduces parasitic capacitance between conductors. Since parasitic capacitance increases noise coupling and signal crosstalk between conductors, increases power consumption, slows circuit operation, and potentially introduces timing faults, the parasitic capacitance associated with insulating isolation should be minimized.

Conventional semiconductor devices often use silicon dioxide, and other materials, as an insulating material between adjacent conductors. Insulating material is deposited over the conductors so that the spaces between adjacent co-planar conductors are completely filled by the insulating material. Alternatively, trenches, which are filled with conductive material forming the conductors, may be formed in the insulating material. Often the same insulating material is also provided over the conductors as well.

Air-gaps are also thought to be good insulators between adjacent conductors because air is a relatively good dielectric. Previously, air-gaps have been formed by providing a conformal thin insulator film around a conductor, but this has problems with poor step coverage. It has been suggested that air-gaps between adjacent conductors may be formed by burning off a material between adjacent conductors to leave air-gaps. Burning refers to the process of converting a solid into a gas that can then easily diffuse out of the material of interest. The efficacy of burning material, however, has not yet been shown. Further, deposition methods with non-conformal characteristics, commonly referred to as bread loaf-like, still deposit some amount of dielectric on the sidewalls and bottom of the gap. This reduces the cross-sectional area of the air-gap. Alternative methods for forming such air-gaps between adjacent conductors are therefore desirable.

DETAILED DESCRIPTION OF THE INVENTION

In the following detailed description, reference is made to certain example embodiments. These embodiments are described with sufficient detail to enable those skilled in the art to practice them. It is to be understood that other embodiments may be employed, and that various structural, logical, and electrical changes may be made without departing from the spirit or scope of the invention.

The term "substrate" used in the following description may include any supporting structure including, but not limited to, a semiconductor substrate that has an exposed substrate surface or a semiconductor substrate having one or more overlying material layers. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions, junctions or material layers in or over the base semiconductor or foundation. The substrate also need not be formed of a semiconductor material, but may be any support structure suitable for supporting an integrated circuit, including, but not limited to, metals, alloys, glasses, polymers, ceramics, and any other supportive materials as is known in the art.

Embodiments described herein provide methods of fabricating air-gap insulators between adjacent conductors in a semiconductor device using nanoparticles. The term "adjacent conductors" can refer to two or more co-planar conductors that, at some location, are adjacent to one another in a semiconductor device. Conductors within the same layer, may be co-planar, i.e., in the same plane. Non-limiting examples may include access lines, for example word lines, data/sense lines, for example bit lines, and source or drain lines in memory devices. Conductors may include a stack comprised of at least one electrical conductor and may include at least one layer of electrically insulating material.

Figure 1A:
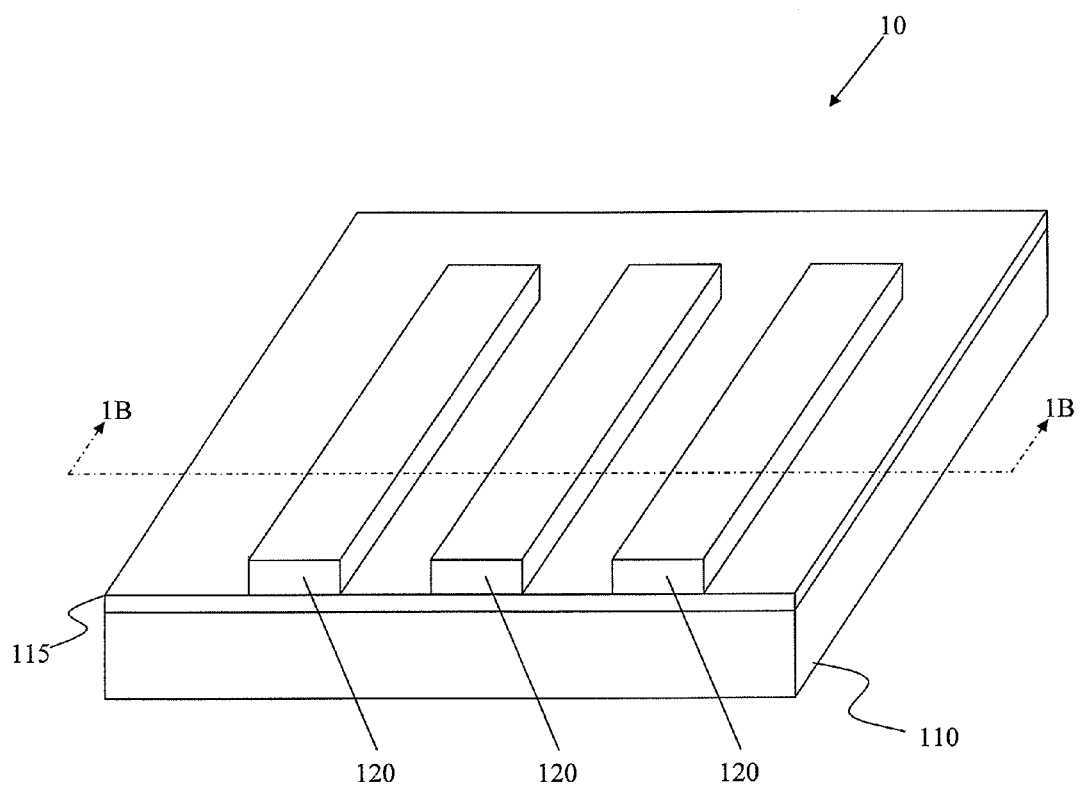
FIG. 1A illustrates in perspective view adjacent spaced conductors in accordance with embodiments described herein.
Figure 1B:
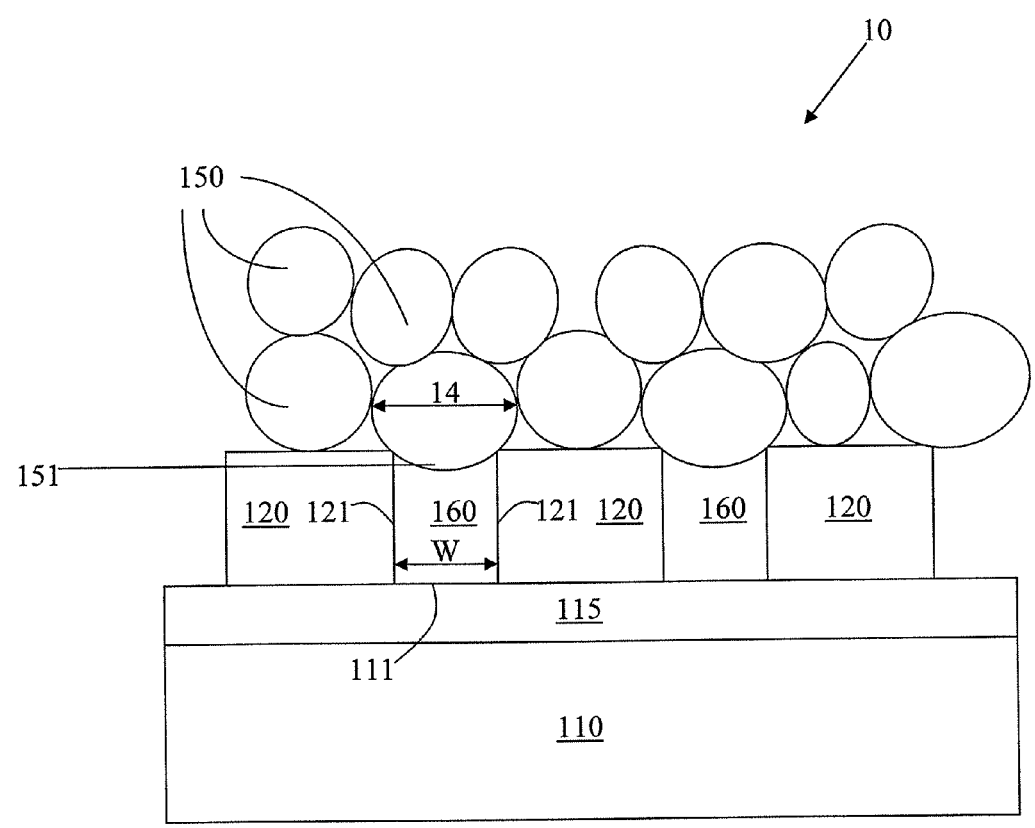
FIG. 1B illustrates in cross section how the FIG. 1A conductors and spaces between them may be covered with nanoparticles in accordance with embodiments described herein forming air-gaps between adjacent conductors.

Referring to FIGS. 1A and 1B, an embodiment is now described with reference to the fabrication of an air-gap for use in semiconductor devices with adjacent co-planar conductors. Like reference numbers are used consistently for like features throughout the drawings.

FIG. 1A illustrates a perspective view of semiconductor device 10 that includes a plurality of adjacent co-planar conductors 120 formed over an insulating material 115 which may be provided over a substrate 110, e.g., over a semiconductor substrate. In one embodiment, the device 10 is a memory device and the conductors are word lines connecting a row decoder to rows of memory cells. For word lines, the conductors 120 may each include a stack comprising a gate oxide 2, a conductive gate 4, and an overlying insulator 6 over the conductive gate forming the gate stack with an insulator 8 on the sidewalls of the word line, as shown for example in FIG. 2. The conductors 120 may also be provided over interlayer dielectrics at different levels in a semiconductor device as well, and may be, for example, metal or polysilicon lines forming upper level bit lines of a memory device. Conductors may include a stack comprised of at least one electrical conductor and may include at least one layer of electrically insulating material.

Figure 2:
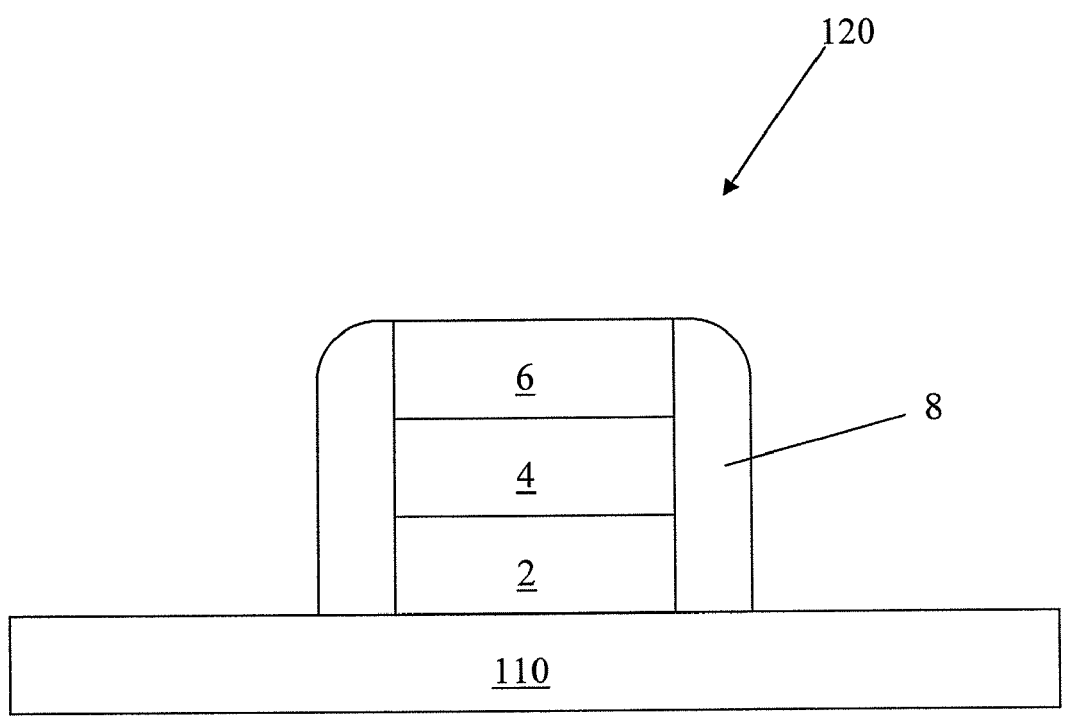
FIG. 2 illustrates a cross sectional view of an exemplary conductor as a word line comprising a gate stack with multiple material layers.

FIG. 1B illustrates a cross-sectional view of the semiconductor device 10 taken along line 1B of FIG. 1A showing a plurality of adjacent co-planar conductors 120 and insulating material 115 over substrate 110. For simplicity, the conductors 120 in FIG. 1B are shown as formed of a single conductive material, but as noted, particularly for word lines formed as a gate stack, the conductors 120 may have multiple material layers, as shown in FIG. 2. In the case of word lines, such as shown in FIG. 2, the conductors 120 may be provided directly on the surface of a semiconductor substrate 110. Referring again to FIG. 1B, the conductors are spaced from one another forming spaces 100 (shown in FIG. 4B) between them. Nanoparticles 150 are deposited (e.g., by spin-on, wet or dry spray, electro-hydrodynamic emission) over semiconductor device 10 such that an air-gap 160 is retained between adjacent conductors 120. Each air-gap 160 is defined by a top surface 111 of insulating material 115, sidewalls 121 of at least two adjacent co-planar conductors 120, and bottom surface 151 of at least one nanoparticle 150. Nanoparticles 150 have a cross-sectional equatorial width 14, as shown in FIG. 1B, which prevents the nanoparticles 150 from substantially entering into the air-gaps 160.

Figure 3A:
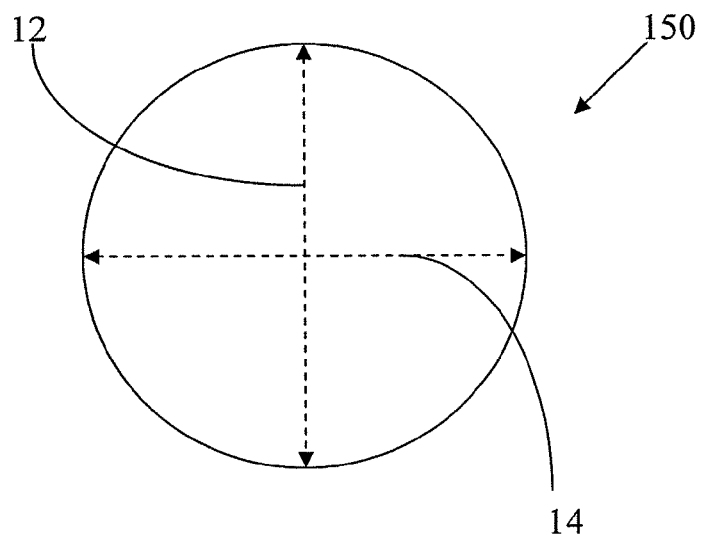
FIGS. 3A-3B illustrate in cross sectional view respective example shapes of the nanoparticles which may be used in accordance with embodiments herein.
Figure 3B:
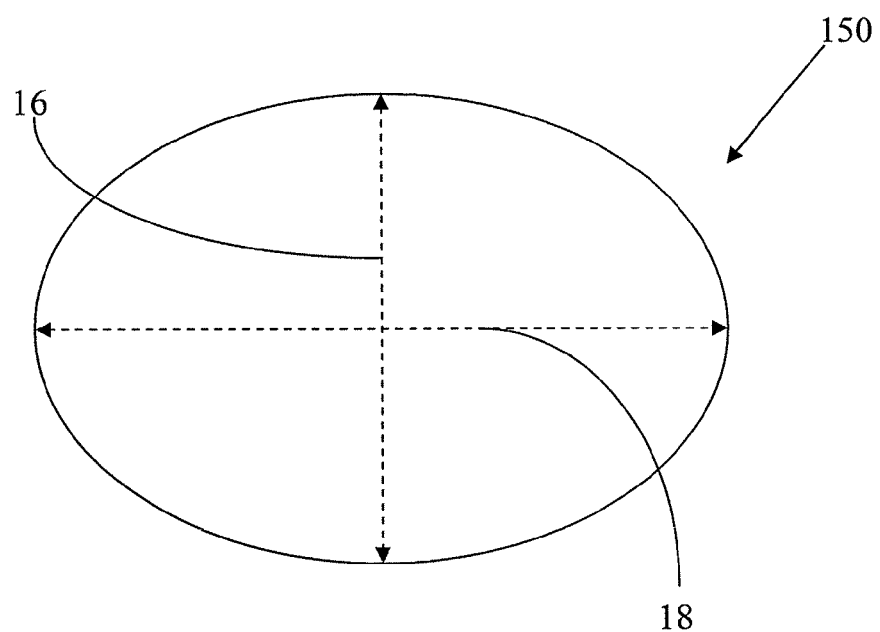

Nanoparticles 150 may have any suitable shape. FIGS. 3A and 3B illustrate two example shapes of the nanoparticles 150. Specifically, FIG. 3A shows a nanoparticle 150 having a substantially circular cross-section, and FIG. 3B shows a nanoparticle 150 that has a generally ellipse shaped cross-section. The nanoparticle 150 shown in FIG. 3A has cross-sectional equatorial widths 12 and 14. The nanoparticle 150 shown in FIG. 3B has cross-sectional equatorial widths 16 and 18. The cross-sectional equatorial widths are taken across the widest points of the nanoparticles 150 in the vertical and horizontal directions. The cross-sectional equatorial widths 12, 14, 16, 18 are such that the minimum equatorial widths of the nanoparticles 150 are larger than the width W of air-gaps 160 between adjacent co-planar conductors 120, thereby preventing any nanoparticles from substantially entering into the air-gaps 160.

Even though the nanoparticles 150 cannot pass entirely into the air-gap 160 between adjacent conductors, a small portion of a nanoparticle may pass partially into such spaces. Thus, an individual nanoparticle 150 may pass into a space between co-planar conductors 120 until the nanoparticle 150 reaches a point at which the size of the nanoparticle precludes further entry into the space because it is larger than the width W of the air-gap 160. For this reason, and as shown in FIG. 1B, a portion of nanoparticle 150 may partially penetrate the air-gap 160 between adjacent conductors. In one embodiment, the nanoparticles 150 may have minimum equatorial widths that range from about 50 nm to about 100 nm while the space between co-planar conductors may have horizontal widths W of less than about 50 nm, for example, a width W of 30 nm. Horizontal widths W of the air-gaps 160 can be in the range of about 30 nm to about 80 nm, as long as the width W is smaller than the smallest cross-sectional equatorial width of the smallest nanoparticle 150. Accordingly, an air-gap with a substantial volume may be formed with increased efficacy and process simplicity.

Figure 4A:
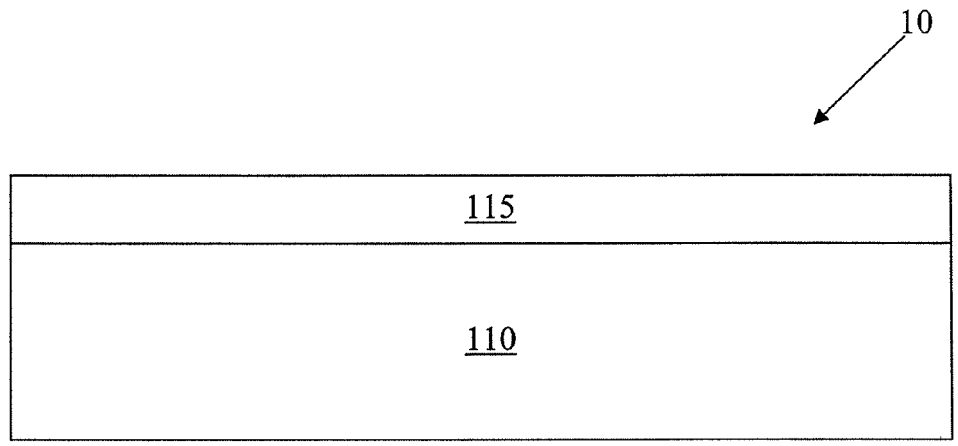
FIGS. 4A-4B illustrate in respective cross sectional views the formation of adjacent conductors and spaces between adjacent conductors in accordance with embodiments described herein.
Figure 4B:
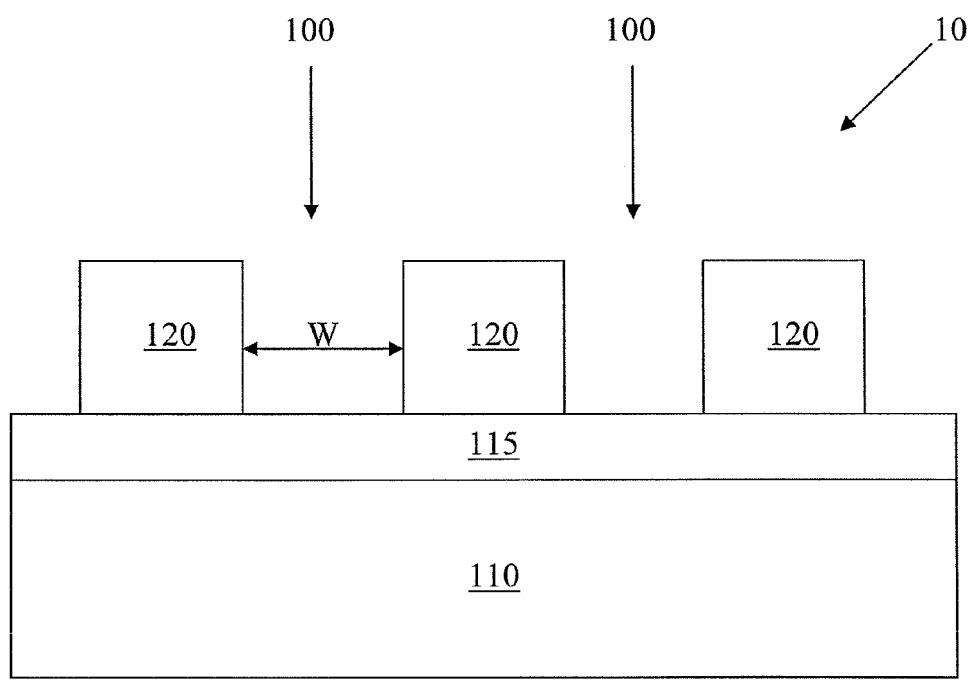

The conductors 120 and associated spaces 100 (shown in FIG. 4B) may be formed by any suitable method. In one embodiment, insulating material 115 is deposited on substrate 110 as shown in FIG. 4A. Then, conducting material is blanket deposited and etched with a mask to create conductors 120 with the spacing shown in FIG. 4B. As an example, the conductors 120 may be word lines in which case materials forming a gate stack are directly deposited sequentially on a semiconductor surface. These layers can be blanket deposited and then etched to form the word lines, after which a sidewall insulator may be applied. Alternatively, conductors 120 can be formed of other conductive material, for example, metal or polysilicon and can be used at upper levels of a semiconductor device, e.g., bit lines in a memory device. It should be understood that the method of forming the conductors 120 and the spaces 100 can be varied and should not be considered limiting to the disclosed embodiments.

Nanoparticles 150 may be deposited by any suitable method (e.g., spin-on, wet or dry spray, electro-hydrodynamic emission). In some embodiments, nanoparticles 150 may be formed cost-effectively, and to tightly-controlled tolerances with conventional methods of forming nanoparticles. The nanoparticles may be dispersed in a liquid carrier to form a mixture, and the deposition of the nanoparticles may comprise spin-coating of such mixtures across space 100 and/or spraying of the mixtures across space 100. Subsequently, the liquid may be evaporated to leave the construction shown in FIG. 1B. The nanoparticles 150 may comprise at least one material from the group consisting of silicon oxide, silicon nitride, silicon oxinitride, SiOC, SiOCH, non-silicon dielectrics such as aromatic polymers and aromatic polyamides or any other dielectric that can be made into nanoparticles. It should be understood that the method of depositing nanoparticles 150 can be varied and should not be considered limiting to the disclosed embodiments.

Figure 5:
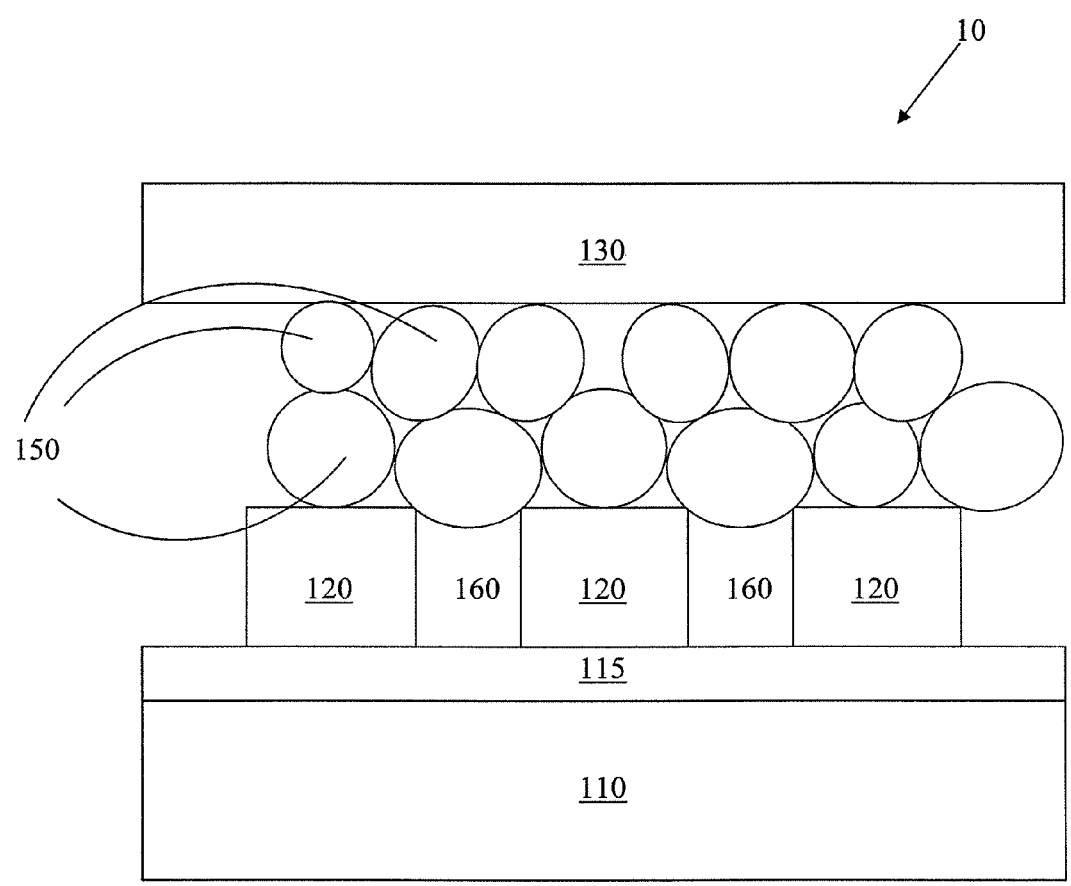
FIG. 5 illustrates in cross sectional view the formation of a material over the nanoparticles shown in FIG. 1B.
Figure 6:
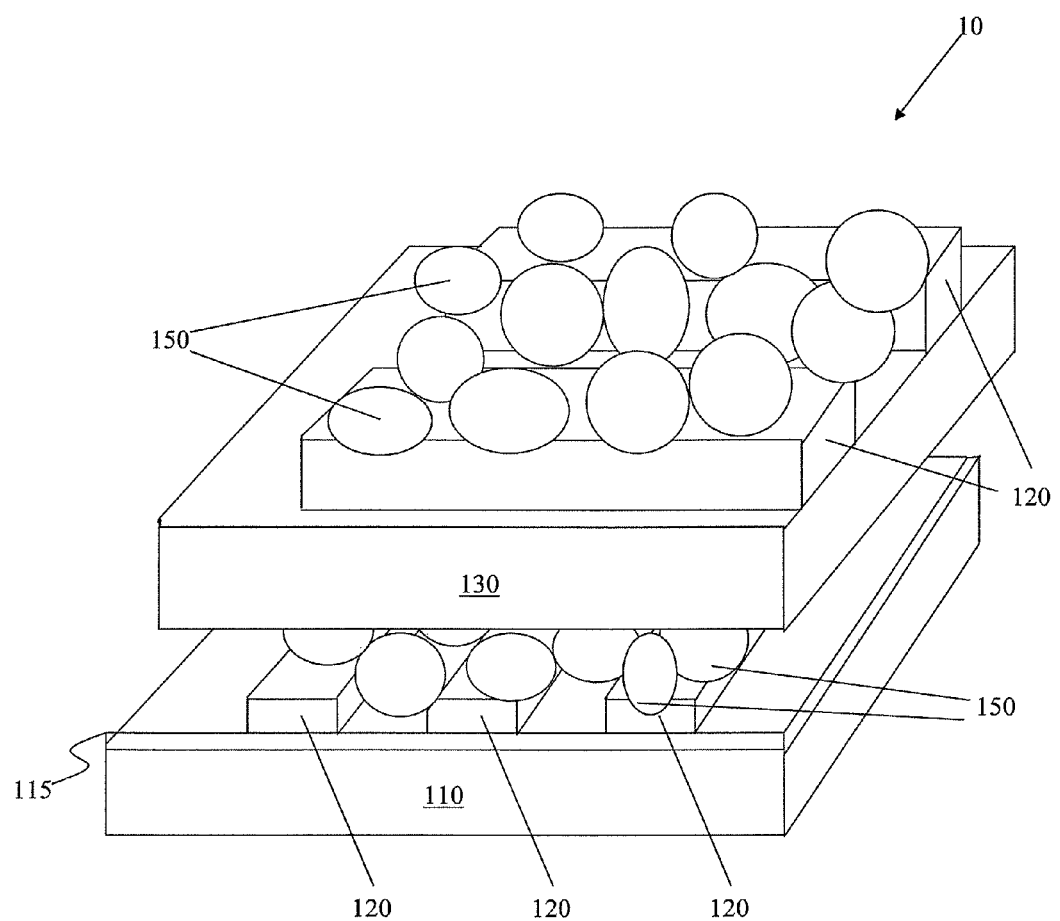
FIG. 6 illustrates in perspective view the formation of multiple layers of adjacent conductors and associated air-gaps in accordance with embodiments described herein.

After the nanoparticles 150 are deposited, the nanoparticles 150 may be sealed, as shown in FIG. 5, by an insulating material 130 such as BPSG or other known insulating materials using known methods such as blanket deposition using physical vapor deposition (PVD), chemical vapor deposition (CVD), spin-on coating, etc. It should be understood that after nanoparticles 150 are sealed by the insulating material 130, additional conductors may be formed on or over insulating material 130 or at higher elevated layers within a semiconductor device and the method of using nanoparticles 150 to form air-gaps 160 according to an embodiment herein can be repeated, as shown in FIG. 6, for example. Conductors 120 in different layers may be perpendicular or in any other orientation. In one embodiment, there may be a layer (not shown) between nanoparticles 150 and insulating material 130 that would be a preferred nanoparticle sealant, but not necessarily the preferred insulating material between levels. As can be seen, the disclosed embodiments provide covered air-gaps 160 between conductors 120 in a simple and efficient manner. Moreover, the disclosed embodiments provide air-gaps 160 with substantially more volume between adjacent conductors than conventional conformal film techniques.

Figure 7:
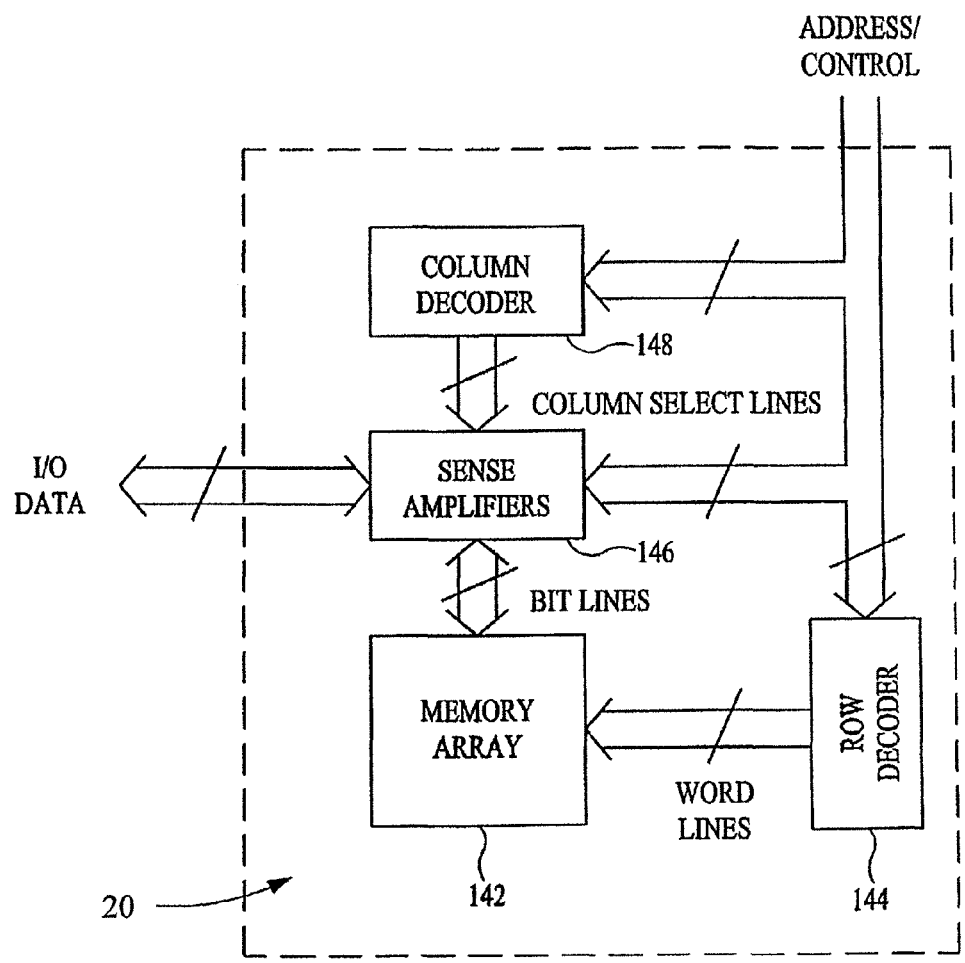
FIG. 7 is a schematic diagram of a memory device formed in accordance with embodiments described herein.

A semiconductor device formed according to one embodiment may include a memory device 20 having memory array 142 employing adjacent conductors 120. A representative memory device 20 is shown in FIG. 7. Memory device 20 includes memory array 142, row and column decoders 144, 148 and a sense amplifier 146. The memory array 142 consists of a plurality of memory cells which may include bit lines, word lines, and other adjacent co-planar conductors insulated by air-gaps as described above. The bit lines of the memory array 142 are connected to the sense amplifier circuit 146, while the word lines are connected to the row decoder 144. Address and control signals are input into the memory device 20 and connected to the column decoder 144, sense amplifier circuit 146 and row decoder 144 and are used to gain read and write access, among other things, to the memory array 142.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings, but is only limited by the scope of the appended claims.

We claim:

1. A method of fabricating a semiconductor device comprising:

forming at least two adjacent co-planar conductors on a support material, the conductors defining a gap between them; and depositing a plurality of nanoparticles over the conductors and gaps, the nanoparticles having a size which causes them to bridge across the adjacent co-planar conductors.

2. The method of claim 1, wherein each nanoparticle has a minimum equatorial cross-section that is larger than a maximum horizontal width of each gap.

3. The method of claim 1, wherein the nanoparticles are deposited by spin-on deposition.

4. The method of claim 1, wherein the nanoparticles are deposited by wet or dry spray.

5. The method of claim 1, wherein the nanoparticles are deposited by electro-hydrodynamic emission.

6. The method of claim 1, wherein the adjacent co-planar conductors are arranged parallel to one another.

7. The method of claim 1, wherein two distinct layers of adjacent co-planar conductors are arranged perpendicular to one another.

8. The method of claim 7, wherein at least one of the two distinct layers of adjacent co-planar conductors comprises one of word lines and bit lines.

9. The method of claim 1, wherein a gap has a maximum width of about 30 nm to about 80 nm.

10. The method of claim 1, wherein each said nanoparticle comprises at least one material from the group consisting of silicon oxide, silicon nitride, silicon oxinitride, SiOC, SiOCH, aromatic polymers, and aromatic polyamides.

* * * * *